United States Patent [19]
Golladay

[11] Patent Number: 5,606,261
[45] Date of Patent: Feb. 25, 1997

[54] RETARDING FIELD ELECTRON-OPTICAL APPARATUS

[75] Inventor: Steven D. Golladay, Hopewell Junction, N.Y.

[73] Assignee: International Business Machines, Corporation, Armonk, N.Y.

[21] Appl. No.: 659,546

[22] Filed: Jun. 6, 1996

Related U.S. Application Data

[63] Continuation of Ser. No. 329,033, Oct. 25, 1994, abandoned.

[51] Int. Cl.$^6$ .................................................. G01R 31/305
[52] U.S. Cl. .......................................... 324/751; 250/310
[58] Field of Search ........................... 324/751; 250/310, 250/311

[56] References Cited

U.S. PATENT DOCUMENTS

| | | | |
|---|---|---|---|
| 4,675,524 | 6/1987 | Frosien et al. | 250/310 |
| 4,713,543 | 12/1987 | Feuerbaum et al. | 250/310 |
| 4,755,748 | 7/1988 | Lin | 324/765 |
| 4,786,806 | 11/1988 | Listl et al. | 250/310 |
| 4,812,651 | 3/1989 | Feuerbaum et al. | 250/310 |
| 4,829,243 | 5/1989 | Woodard, Sr. et al. | 324/751 |
| 4,831,266 | 5/1989 | Frosien et al. | 250/347 |
| 4,843,330 | 6/1989 | Golladay et al. | |
| 4,978,855 | 12/1990 | Liebl et al. | 250/310 |
| 5,097,204 | 3/1992 | Yoshizawa et al. | 324/751 |
| 5,146,090 | 9/1992 | Plies | 250/310 |
| 5,389,787 | 2/1995 | Todokoro et al. | 250/310 |

FOREIGN PATENT DOCUMENTS

242602B1 7/1993 Germany.

OTHER PUBLICATIONS

Munro, E., et al., "High Resolution, Low-Energy Beams by means of Mirror Optics" J. Vac. Sci. Technol. B vol. 6, No. 6, Nov./Dec. 1988.

Frosien, et al., "Compound Magnetic and Electrostatic Lenses for Low-Voltage Applications", J. Vac. Sci. Technol. B vol. 7 No. 6, Nov./Dec. 1989.

*Primary Examiner*—Ernest F. Karlsen
*Assistant Examiner*—Russell M. Kobert
*Attorney, Agent, or Firm*—Whitham, Curtis, Whitham & McGinn; Charles W. Peterson, Jr.

[57] ABSTRACT

A method of noncontact testing and an electron optical system includes an electron source for producing a high energy electron beam, a retarding field objective lens system for receiving and focussing the high energy electron beam to produce a focussed low energy electron beam, and a magnetic deflector for deflecting the focussed low energy electron beam to the sample, thereby to expose the sample to the low energy electron beam, and simultaneously maintaining a predetermined spot size of the beam. The retarding field objective lens system includes a device for retarding electrons in the low energy electron beam directed to the sample and for accelerating electrons, emitted by the sample upon being irradiated by the low energy electron beam.

22 Claims, 12 Drawing Sheets

PARAMETERS OF LENS, AND DEFLECTORS (MD):

| NO. | TYPE | AXIAL POSITION (MM) ZC | REL. STRENGTH RS | ROT. ANGLE (DEG) |
|---|---|---|---|---|
| 1 | LENS | −266.0 | 1.00 | |
| 2 | MD1 | −223.0 | 1.00 | 0.0 |
| 3 | MD2 | −153.0 | 3.00 | −170.0 |

FIRST-ORDER OPTICAL PROPERTIES:

LENS MAGNIFICATION = 3.5181   LENS ROTATION ANGLE = 74.3661 (DEG)
MAIN DEFL-DIRECTION = −168.4039 (DEG)
BEAM SEMI-ANGLE AT TARGET = .005 RADIANS
ENERGY SPREAD OF BEAM = 1.5 V.

ABERRATIONS AND BEAM LANDING ANGLE:

|  | AXIAL | MAIN-DEFL |
|---|---|---|
| SPHERICAL ABERRATION ... (MICRONS) = | 0.118 | |
| COMA .............(MICRONS) = | | 0.897 |
| FIELD CURVATURE ......(MICRONS) = | | 111.589 |
| ASTIGMATISM ........(MICRONS) = | | 2.694 |
| DISTORTION .........(MICRONS) = | | 824.404 |
| CHROMATIC ABERRATION ...(MICRONS) = | 0.951 | 1.432 |
| LANDING ANGLE .......(DEGREES) = | | 3.901 |

OVERALL AB BEFORE DYNAMIC CORRECTIONS (MICRONS) = 111.638
OVERALL AB AFTER DYNAMIC CORRECTIONS (MICRONS) = 1.943

FIG.12

RETARDING FIELD ELECTRON-OPTICAL APPARATUS

This is a Continuation of Application Ser. No. 08/329,033 filed Oct. 25, 1994 now abandoned.

DESCRIPTION

BACKGROUND OF THE INVENTION

1. Field of the Invention

The present invention relates to an improved retarding field optical apparatus for focusing and deflection of high resolution, high-current, low-energy charged particle beams. Additionally, the present invention relates to apparatus for detecting the charging currents produced by such a beam when the beam interacts with a target, the detection apparatus being physically and electrically integrated with the retarding field apparatus so as to provide a system providing excellent signal detection and improved optical performance.

More particularly, a preferred embodiment of the present invention relates to a method and system for using an electron beam to test conductive networks in multi-chip modules (MCMs) for such defects as opens between networks which should be electrically connected and shorts between networks which should be electrically isolated, using an electron beam capable of large field deflections at low voltages.

2. Description of the Related Art

There are many important applications for high-resolution, high-current, low-voltage charged particle beams including, for example, applications in microscopy, surface analysis, integrated circuit testing, and lithography.

Within the field of electron beam column technology, which is concerned with apparatus for the production, focussing, and deflection of beams of electrons or other charged particles, the difficulty of producing low-voltage beams by conventional techniques is well known. Factors contributing to these difficulties include: i) the proportionality of source brightness to beam voltage; ii) the additional reduction of source brightness at low-voltage due to electron-electron interaction effects and space charge saturation effects; iii) the increased chromatic aberration of lenses and deflectors; and iv) increased beam sensitivity to the disturbing effects of ambient magnetic fields and charging within the column.

Recently, the advantages of employing an unconventional approach to the production of low voltage beams have been recognized. The new approach involves accelerating the beam to a kinetic energy that exceeds the desired landing energy at the target and subsequently decelerating or retarding the beam to the desired impact kinetic energy. This new approach is termed "a retarding field technique" (RFT).

The RFT has two primary advantages. First, the stronger accelerating field at the electron source improves source brightness at low voltage. Secondly, the decelerating or retarding field, appropriately designed, can be combined with a conventional lens with the result that the performance of the combination is much better than that of the conventional lens alone.

The optical performance advantages of the RFT are only fully realized when the retarding field immediately precedes the target. Such a configuration, consists of a conventional lens (either magnetic or electrostatic), a retarding field (electrostatic) and then the target. For a probe forming system, the configuration normally must also include means for deflecting the beam. Such a configuration, including deflection means, is termed "a retarding field objective" (RFO).

While the optical performance advantages of RFOs are well known, a problem remains which limits their usefulness. In most applications, one is interested not in the primary beam itself, but in its interaction with a target. Unfortunately combining RFOs with conventional charged particle detectors, which collect electrons emitted because of the beam-sample interaction, is difficult.

The problem arises since the retarding field, which decelerates the primary electrons, is an accelerating field for the electrons emitted from the sample. This acceleration confines the emitted electrons to trajectories which are physically close to the primary beam trajectory. The narrow emission angle of the emitted electrons and their proximity to the primary beam electrons make their detection difficult, since the detector must be simultaneously transparent to primary beam electrons and somehow collect emitted electrons. Further, the collector must be designed so as not to adversely affect the electrostatic field within the retarding field lens.

As a result, as a practical matter, the detector must be outside the retarding field, which means overall system length must be increased to accommodate it. Increased system length decreases the optical performance.

Thus, the retarding field allows production of a better primary beam but simultaneously limits or compromises the ability to determine the sample's features with this beam using conventional electron detectors.

Heretofore the present invention, therefore the design of retarding field objective lenses was driven by a compromise between good performance for primary beam production and good performance for emitted electron detection.

These compromises are well illustrated in a conventional design in which to separate the incoming primary beam electrons and the outgoing emitted electrons, an additional optical element is required. More specifically, a bending magnet, which directs the emitted electrons away from the primary beam so that they can be detected by conventional detectors physically distant from the primary beam, has been required.

This approach has several problems. In addition to the complexity and expense of the bending magnet, there are two additional problems.

First, the bending magnet degrades primary beam resolution. Secondly, the bending magnet rigidly constrains the design of the beam deflection system. The deflection system must not only deflect the primary beam on the target, but simultaneously deflect the emitted electrons so that they travel backwards along the axis of the system so as to enter the bending magnet. This constraint on the deflection system limits the optical performance by restricting the deflection elements to electrostatic elements and limiting how they may be positioned and energized.

Further, it is well known that contactless test systems are needed for the substrates of multi-chip-modules. In the production of multi-chip modules (MCMs), the component parts of the modules should be tested for defects before assembly to minimize the cost of repairing such defects and to maximize the yield of operable devices.

Component testing includes testing for and the detection of opens and shorts in the conductive networks of the substrate on which the integrated circuits are mounted.

Mechanical probe systems are commonly used for this purpose, but these systems oftentimes damage substrates, add particulate contamination, have limited throughput, and are not applicable to feature sizes below approximately 25 micrometers, or to small features recessed into insulators. Because of these problems, non-contact techniques have been investigated for open and short defect detection.

Among the non-contact test systems are electron beam systems which use voltage contrast. However, voltage contrast systems have several drawbacks including the propensity to detect "false" shorts, i.e., to detect shorts between nets which have an inter-net resistance of 100megohms or more.

A second drawback of voltage contrast systems is that primary beam deflection must cover the entire substrate to obtain practical test times.

In view of the foregoing problems of the conventional systems, there is a need for a non-contact substrate testing system which overcomes the above-mentioned problems.

A test system and method which overcomes the above-mentioned problems have been described in copending U.S. Patent Application Ser. No. 08/036,781, to Golladay, filed on Mar. 25, 1993, now U.S. Pat. No. 5,404,116, incorporated herein by reference and assigned to one of the co-assignees of the present application.

The method of Golladay '781 uses an induced current signal to detect defects, and is referred to as an induced current test method (ICTM) in which an induced current signal is detected to determine whether defects exist. The advantages of ICTM include: i) its reduced propensity to detect false shorts; ii) the elimination of the need for full substrate deflection; iii) minimal insulator charging effects because of the use of a relatively low primary beam landing energy, $eV_L$ (e.g., typically in the range of 500–800 eV) on the substrate; and iv) its ability to measure network capacitance.

However, while many of the advantages of the ICTM result from using a low voltage beam, the production and deflection of low voltage beams with high beam current and small spot size is difficult, as discussed above. Nevertheless, despite these difficulties, obtaining sufficiently high beam current in a sufficiently small focussed probe which can be deflected electromagnetically over a sufficiently large deflection field is essential to achieving optimum tester performance.

Thus, the conventional systems, i.e., those not employing RFT, have suffered from not being able to produce a high-resolution, low energy beam with a sufficiently high beam current, nor to deflect a low energy beam over a sufficiently large area, for high throughput production testing due to inherent problems with the conventional approaches.

Moreover, existing systems employing RFT have suffered from the same limitations due to design compromises arising from the incompatibilities of probe formation and emitted electron detection in those systems.

SUMMARY OF THE INVENTION

It is therefore an object of the present invention to provide a system and method for overcoming the above problems of the conventional systems and techniques.

Another object of the invention is to provide a retarding field objective lens and magnetic deflection system to produce a small, high current probe, and to provide means for deflecting the probe over a large field while maintaining acceptable spot size.

It is yet a further object of this invention to provide means for detecting the induced current signal from a substrate at elevated potential by an induced current detector which may be referenced to the substrate potential.

Yet another object is to provide a completely non-contact testing method and system that avoids the problems of contact damage and contamination that are inherent in contact testing, and to increase the testing speed using the electron beam as opposed to a mechanically movable probe.

It is a further object of this invention to provide a retarding field which is compatible with a planar extraction grid provided above the substrate being tested, and which ensures that electrons emitted from the substrate that pass through the extraction grid do not return to the substrate.

In one aspect of the invention, a method for achieving the above and other objects is provided comprising:

elevating the potential of an electrical device; charging said electrical device with a low energy electron beam; producing a focussed low energy electron beam; deflecting the low energy electron beam to predetermined portions of the electrical device, thereby to expose the predetermined portions to the low energy electron beam, and simultaneously maintaining a predetermined spot size of the beam, an induced current signal being produced when the predetermined portions are exposed to the focussed electron beam; and detecting the induced current signal to determine characteristics of the electrical device.

In another aspect of the invention, a system for achieving the above and other objects is provided including:

means for elevating the potential of an electrical device; means for providing a low energy electron beam to the electrical device; means for producing a focussed low energy electron beam; means for deflecting the low energy electron beam to predetermined portions of the electrical device, thereby to expose the predetermined portions to the low energy electron beam, and simultaneously maintaining a predetermined spot size of the beam, an induced current signal being produced when the predetermined portions are exposed to the focussed electron beam; and induced current detecting means for detecting the induced current signal to determine characteristics of the electrical device.

With the invention, a retarding field objective lens and a deflection and detection system for electron beam non-contact testing of MCMs for such defects as opens and shorts, are provided which use an electron beam capable of large field deflections at low voltages to avoid charging problems with the MCM.

With the invention, wiring networks within substrates used to interconnect integrated circuits (ICs) can be electrically tested in a cost-effective manner. Detection of open and short defects in the substrates is accomplished with the invention by an electron beam system utilizing an induced current test method and a retarding field objective lens and deflection system which produces and deflects a high resolution, high current, but low energy, primary electron beam, while simultaneously providing for induced current signal detection.

BRIEF DESCRIPTION OF THE DRAWINGS

The foregoing and other objects, aspects and advantages will be better understood from the following detailed description of preferred embodiments of the invention with reference to the drawings, in which:

FIG. 12 illustrates the calculated first and third order lens properties of the retarding field objective lens according to the invention.

DETAILED DESCRIPTION OF PREFERRED EMBODIMENTS OF THE INVENTION

Figure 1A:
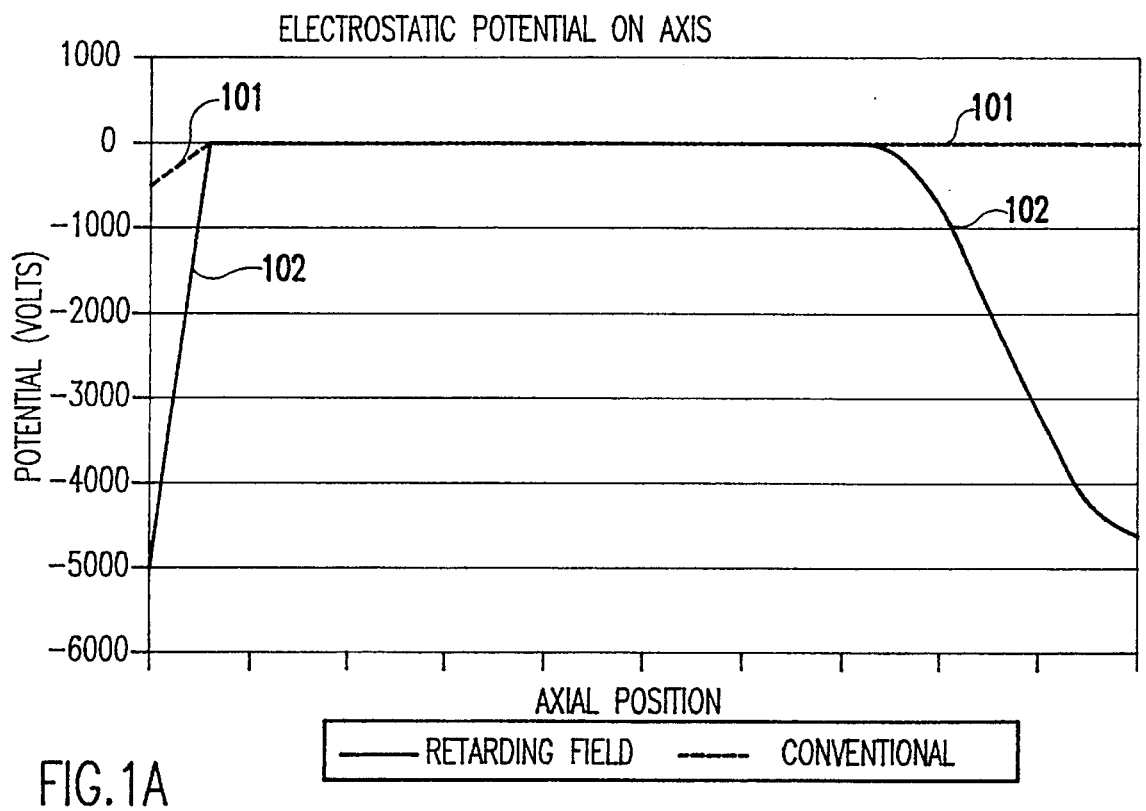
FIG. 1(a) illustrates the electrostatic potential on the axis of an electron beam column in a conventional column 101 and for a column incorporating retarding field technology in the form of a retarding field objective lens 102.

Prior to a description of the structure and method of the invention, basic principles of the theoretical construct of the invention will be discussed and, more specifically, a method having a retarding field technique (RFT) which is used in the present invention will be discussed.

Hitherto the invention, a retarding field technique (RFT) for producing low energy beams has been advocated. For purposes of this application, a "low" energy beam is a beam having an energy of < 1 kV, whereas a "high" energy beam is one having an energy > 1 kV and more typically > 5 kV. While having limited applicability to planar or nearly planar targets, the RFT provides for higher beam currents in a given probe size compared to the conventional methods. RFT improves overall system performance by increasing source brightness and by reducing the aberrations of the probe forming- and beam deflection optical elements. For example, a ten-fold increase in beam current on the lens axis has been found with the retarding field approach.

However, prior to the invention, retarding field systems for large field deflection (>10×10 mm) have been unknown.

The difference between the RFT and the conventional approach can be understood by considering the electrostatic potential along the axis of an electron beam column, and the kinetic energy of the primary beam electrons. The potential and the kinetic energy of the primary beam electrons are illustrated for a conventional system and a system employing RFT in FIGS. 1(a) and 1(b), respectively.

Typically, for both safety and convenience, the anode of the electron source and the bulk of the column are held at ground potential, (e.g., $V_{col}$=0 V (Volts)), for both the conventional and retarding field approaches.

Moreover, with the conventional approach, the target is also at ground potential, while the electron source, or cathode, is at a negative potential, $V_{cath}$, corresponding to the desired beam landing kinetic energy, $E_L$. For example, if $E_L$=600 eV (electron volts), $V_{cath}$ would be −600 V. The primary beam electrons are accelerated to their landing kinetic energy in the vicinity of the cathode, and retain that kinetic energy until impacting the substrate.

The retarding field approach involves producing a beam with a higher kinetic energy than the landing energy and then decelerating the beam with electrostatic fields to achieve a relatively low landing energy. Normally, to reduce saturation and interaction effects in the electron gun, $V_{cath}$ is chosen to be at least 5.0 kV negative relative to the bulk of the column which is typically at ground potential. The target (e.g., sample or substrate) potential is also elevated to negative high voltage. The potential $V_{sub}$, is chosen so that it satisfies the relation of:

$$E_L=-(V_{cath}-V_{sub})$$

In the above equation, $E_L$ is in units of electron volts and the voltages are in units of volts. So, for example, if $V_{cath}$=−5 kV, and $E_L$=600 eV, then $V_{sub}$=−4.4 kV.

Thus, the primary beam decelerates in the retarding field in front of the sample, thereby reducing the beam landing kinetic energy to 600 eV, although the kinetic energy of the beam is at 5.0 keV throughout most of the column. For simplicity and convenience, the present invention is described assuming $V_{col}$=0 Volts and the above values for $V_{cath}$, $E_L$ and $V_{sub}$, although these are only typical or nominal values and any values may be selected, as appropriate, by the ordinarily skilled artisan in the purview of the present application. However, it is required that $V_{cath}<V_{sub}<V_{col}$.

Figure 1B:
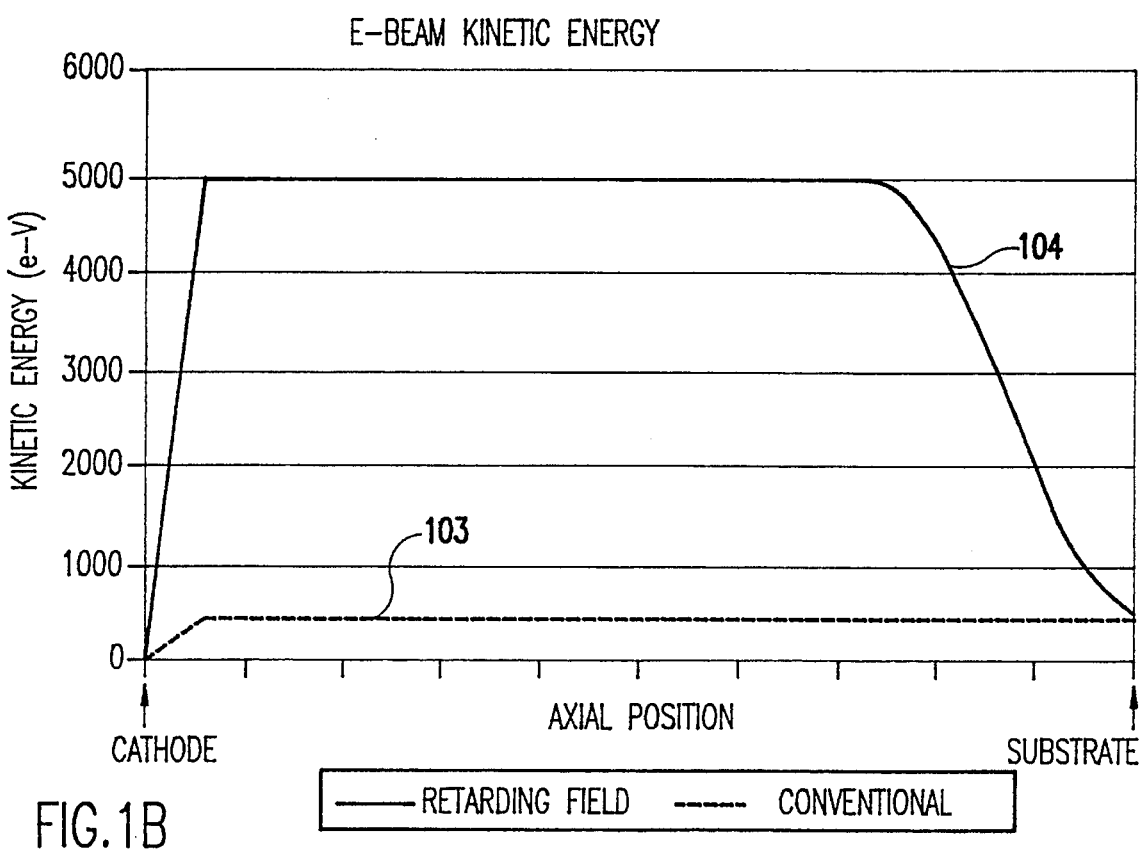
FIG. 1(b) illustrates the kinetic energy of the primary electron beam on the axis of an electron beam column for a conventional column 103 and for a column incorporating a retarding field objective lens 104.

The electrostatic potential and beam kinetic energy along the column axis of the conventional approach and the RFT approach are illustrated in FIGS. 1(a) and 1(b), respectively. FIG. 1(a) shows the electrostatic potential along the axis of the column from the electron source (or cathode) to the target, illustrating how with the RFT the cathode potential is made more negative, and the target potential is also elevated to negative potential. Curve 101 illustrates the conventional system whereas curve 102 illustrates the RFT.

FIG. 1(b) illustrates the beam kinetic energy of the two approaches. With RFT (as shown by curve 104), the beam kinetic energy is relatively higher over most of the column length declining to the landing energy in the vicinity of the target. Curve 103 illustrates the conventional approach.

Along with improving source brightness and reducing beam sensitivity to charging and magnetic field interference, the retarding field approach has another important advantage. That is, a properly designed electrostatic retarding field can operate in combination with a conventional (non-retarding) lens, to produce a high performance lens with low aberration coefficients.

Two factors which are important to good performance in focusing and deflecting the primary beam are the form of the axial potential distribution in the retarding section, and the trajectory of the deflected electrons in the retarding field. The axial potential distribution is optimized by appropriate choice of the geometry and bias potentials of the retarding electrodes.

The trajectory of the deflected electrons is optimized by the choice of deflector type (electrostatic or magnetic), the number, axial position, and relative angular orientation of the deflectors and the relative strengths of the electrical signals which drive them.

However, despite the advantages of retarding field optics for the primary beam, as discussed above, there are problems related to combining RFT with conventional electron detectors. The problems arise since the retarding field which decelerates the primary electrons is an accelerating field for the electrons emitted from the sample. This acceleration confines the emitted electrons to trajectories which are physically close to the primary beam trajectory. The narrow emission angle of the emitted electrons and their proximity to the primary beam electrons makes their detection difficult, since the detector must be simultaneously transparent to primary beam electrons and somehow collect emitted electrons.

Figure 2:
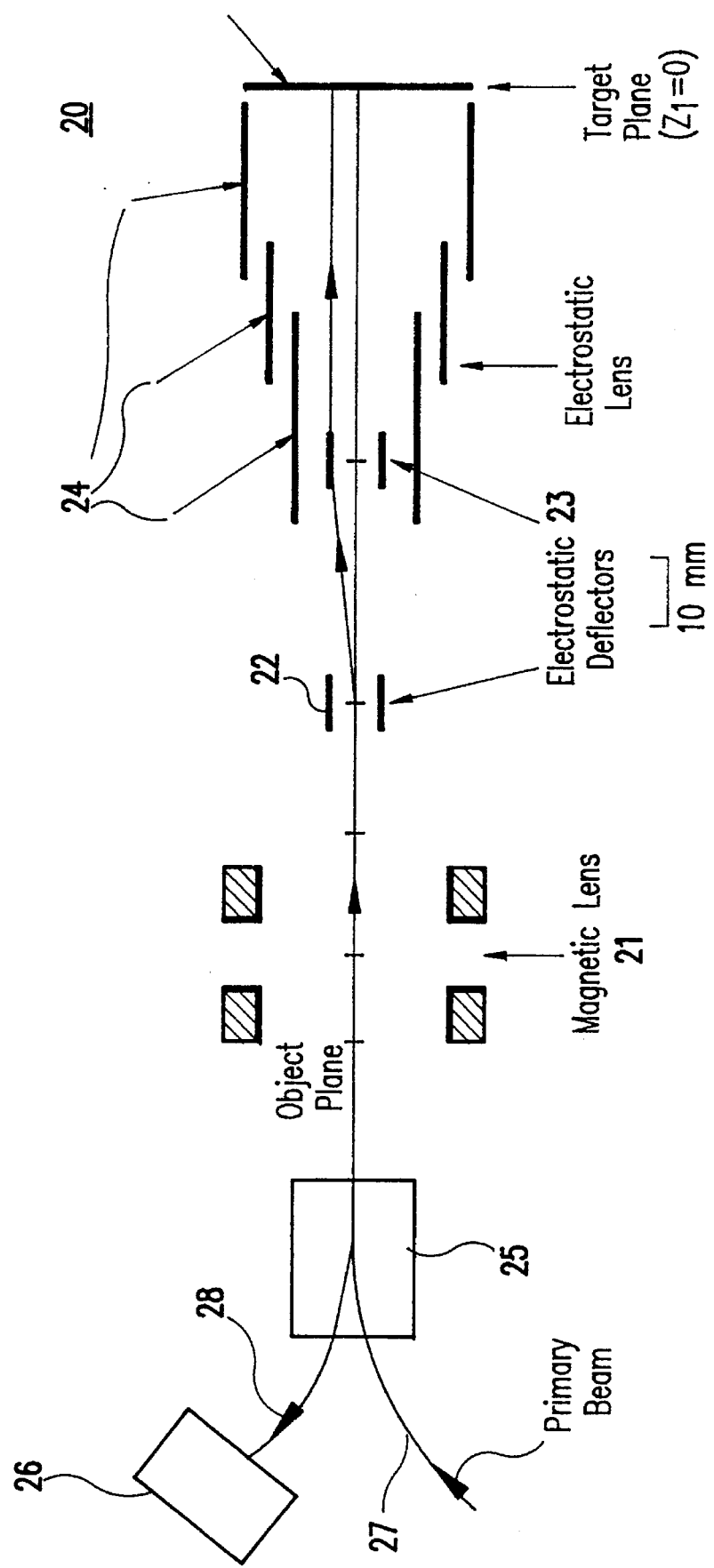
FIG. 2 illustrates a conventional retarding field objective lens, deflection system and emitted electron detector.

These difficulties are illustrated in a conventional design which is illustrated in FIG. 2. This conventional system 20 includes a conventional magnetic lens represented schematically by its pole pieces 21, an upper electrostatic deflector 22, a lower electrostatic deflector 23, retarding field electrodes 24, a bending magnet 25 and electron detector 26.

The bending magnet 25 is for separating the primary beam 27 traveling toward the sample from the emitted electron beam traveling back up the column. The bending magnet 25 directs the emitted electrons 28 away from the primary beam 27 so that they can be detected by conventional detectors 26 physically distant from the primary beam 27.

The above-mentioned conventional approach has several problems. In addition to the complexity and expense of the bending magnet, there are two additional problems. The first problem is that the bending magnet degrades primary beam resolution, and the second problem is that using the bending magnet rigidly constrains the design of the beam deflection system. The deflection system must not only deflect the primary beam on the target, but at the same time deflect the emitted electrons so that they travel backwards along the axis of the system so as to enter the bending magnet. This constraint on the deflection system limits the optical performance by requiring electrostatic deflection elements and limiting how they may be positioned and energized.

The conventional deflection system consists of a pair of identical electrostatic deflectors, an upper deflector 22 and a lower deflector 23, equally and oppositely driven. Each deflector typically consists of elements for producing deflections in two orthogonal directions, conventionally designated "x" and "y" deflectors. Such a pair of identical deflectors equally and oppositely driven displaces a beam parallel to itself. Thus, the primary beam initially traveling on the axis of the system 20 is displaced off this axis but still travels parallel to it. The emitted electrons travel the same path in the reverse direction, thereby ending up traveling along the system axis to the bending magnet 25.

This approach has the drawback that it can be implemented only with electrostatic deflectors. Magnetic deflectors are excluded because the magnetic deflection is oppositely directed for the incoming and outgoing beam. This effect is exploited by the conventional system in the bending magnet 25 to separate the incoming and outgoing beams. Magnetic deflectors would have the same beam separating effect and therefore would not direct the emitted electrons back along the optical axis.

The requirement to use electrostatic deflectors is a significant limitation because magnetic deflectors offer improved optical performance and simpler practical implementation. The improved optical performance results from i) inherently lower chromatic aberrations, ii) and the deflection yokes being positionable so that the magnetic deflection fields overlap the electrostatic retarding fields, thereby shortening system length.

There are also several practical advantages with respect to ease of implementation of magnetic yokes. For example, the ability to position the magnetic deflectors outside the vacuum vessel means that the yoke position or orientation can be more easily adjusted, the system is more easily assembled and serviced, and there is no possibility of beam-induced contamination of the deflectors.

Furthermore, the conventional system's requirement of equal and opposite deflection sensitivity for the upper and lower deflectors is a significant limitation. The benefits of a more general approach to beam deflection are well known. With a deflection system consisting of multiple yokes, improved performance has been demonstrated by optimizing the yokes' geometry as well as their relative strengths and orientations, their positions relative to each other and relative to a magnetic objective lens.

The problems and design restrictions of the conventional approach discussed above are a direct result of the difficulties of combining retarding field optics and conventional emitted electron detectors.

These problems and design restrictions are eliminated with the present invention in which the retarding field configuration includes magnetic deflectors and is used in combination with an alternative signal detection scheme. Of primary interest for one preferred embodiment of the present invention is an induced current detector, but other types of radiation detectors are also possible (e.g., X-ray, photo or infrared detectors). Such a combination of technologies was unknown hitherto the invention and its advantages were unrecognized.

Figure 3:
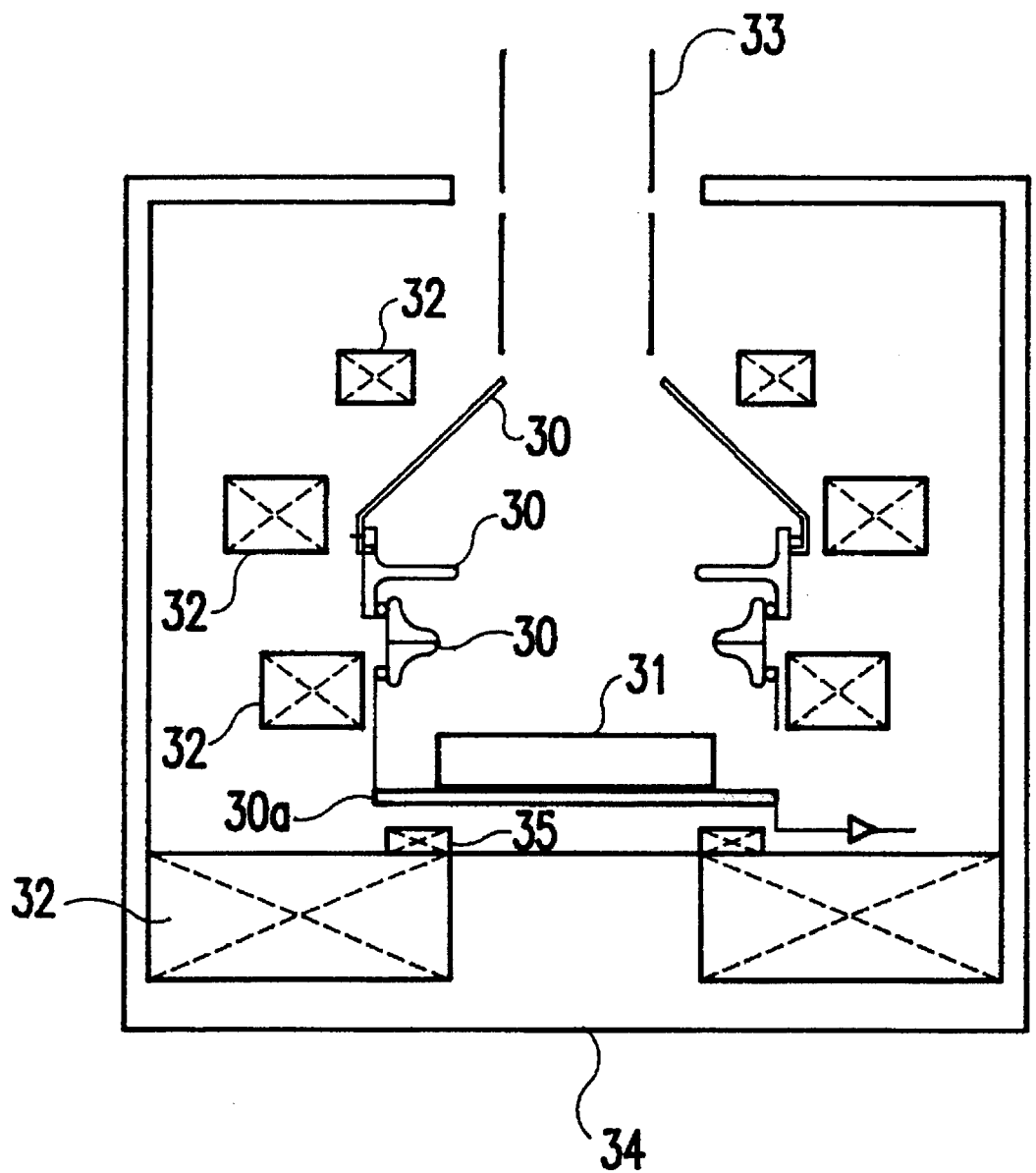
FIG. 3 illustrates one embodiment of the retarding field objective lens, deflection system and electron detector according to the present invention.

An example of a first preferred embodiment of the present invention is shown in FIG. 3, which illustrates some of the general design possibilities enabled by the present invention. A more detailed description of a second embodiment specifically directed toward the application of substrate testing will be given later.

In the design of FIG. 3, a plurality of electrodes 30 provide the electrostatic retarding field. The electrodes 30 include a planar electrode 30a below a target 31 which is at an elevated negative potential. The electrodes above the target 31 are constructed to have axial symmetry and are positioned so that their symmetry axes are aligned with the axis of the rest of the electron optical column.

The magnetic focusing field is provided by the magnetic lens structure 34 which includes a coil 35. Beam deflection is provided by at least one magnetic 32 deflection element and/or electrostatic deflection element 33. The electrostatic deflection means 33 are located above the retard electrodes 30. The magnetic deflection elements 32 are located either above the retard electrodes, or outside the retard electrodes, or below the target, or in any combination of the above positions.

Hereinafter, a detailed description is provided of a preferred embodiment of the present invention which is directed toward the application of substrate testing. For this application, the detected signal is the current, capacitively induced, in a conductive structure within or close to the target, when the target is irradiated by a low voltage primary beam.

Unlike a conventional electron detector, which collects emitted electrons, the induced current detector senses the effect of the emitted electrons without collecting them. Therefore, this detector is indifferent to the emitted electron trajectories as long as the emitted electrons do not return to the substrate under test.

Furthermore, the induced current detector can be physically located beneath the target. The detector's physical location and its indifference to the emitted electron trajectories give the electron optical designer a great deal of freedom to optimize those components above the sample (e.g., namely the RFO and deflection system), with respect to performance in focusing and deflecting the primary beam.

Figure 4:
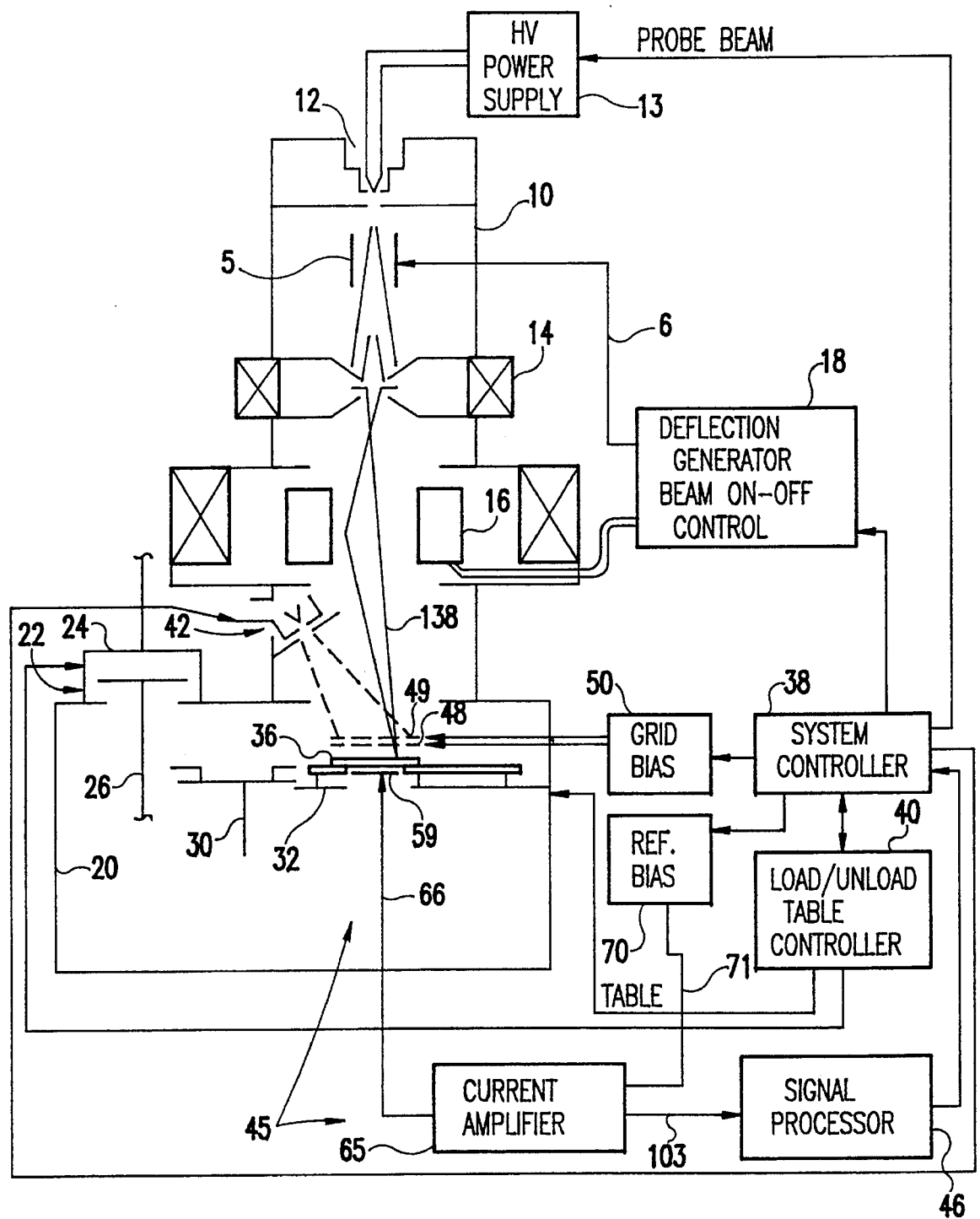
FIG. 4 illustrates a substrate tester designed for the practice of the induced current test method (ICTM) but with conventional column technology.

Referring now to the drawings, and more particularly to FIG. 4, there is shown a block diagram of a conventional electron-beam test system for use with the present invention. A description of the system of FIG. 4 is found in U.S. Patent Application Ser. No. 08/036,781, now U.S. Pat. No. 5,404,110, mentioned above and incorporated herein by reference, and in which a conventional approach to producing a low energy beam was followed.

With this approach, a cathode (e.g., an electron beam probe gun) 12 is biased to a negative potential, corresponding to the desired beam landing energy (e.g., −600 V potential for a 600 eV landing energy), and the rest of the electron beam optical system including the target substrate 36, a vacuum chamber 20, a conductive structure 59 capacitively coupled to the target substrate, extraction grids 48, 49 coupled to an extraction grid bias supply 50, and a current amplifier 65 coupled to a reference bias supply 70, are each at ground or biased by low voltage power supplies referenced to ground. The electron source beam emanating from the electron beam probe gun 12 is demagnified by a focussing lens assembly 14 including an upper magnetic objective lens (unreferenced) and is focussed onto the substrate 36 by the magnetic objective lens. Beam deflection is performed by annular deflection yokes (coils) 16 driven by a deflection generator 18. The current amplifier 65 supplies induced current in a conductive structure within or in close proximity to the test specimen.

The system shown in FIG. 4 provides the platform for the retarding field optics and detection scheme of the present invention. The high voltage supply and electron beam source 12 support production, alignment, and demagnification of a higher energy beam, 5 kV or more, for the present embodiment of the invention. However, certain changes must be made in the physical structure of a conventional system to accommodate the deflection system and retard electrodes of the present invention.

The detailed physical design of this preferred embodiment of the invention has been dictated in part by the desire to facilitate incorporation of the present invention into existing electron beam systems with minimal modifications. To that end, a design was chosen which required minimal changes to a conventional magnetic lens, and the retarding field electrode assembly was designed to fit in the space between the sample and the magnetic lens in the space usually occupied by the emitted electron detectors.

Figure 5:
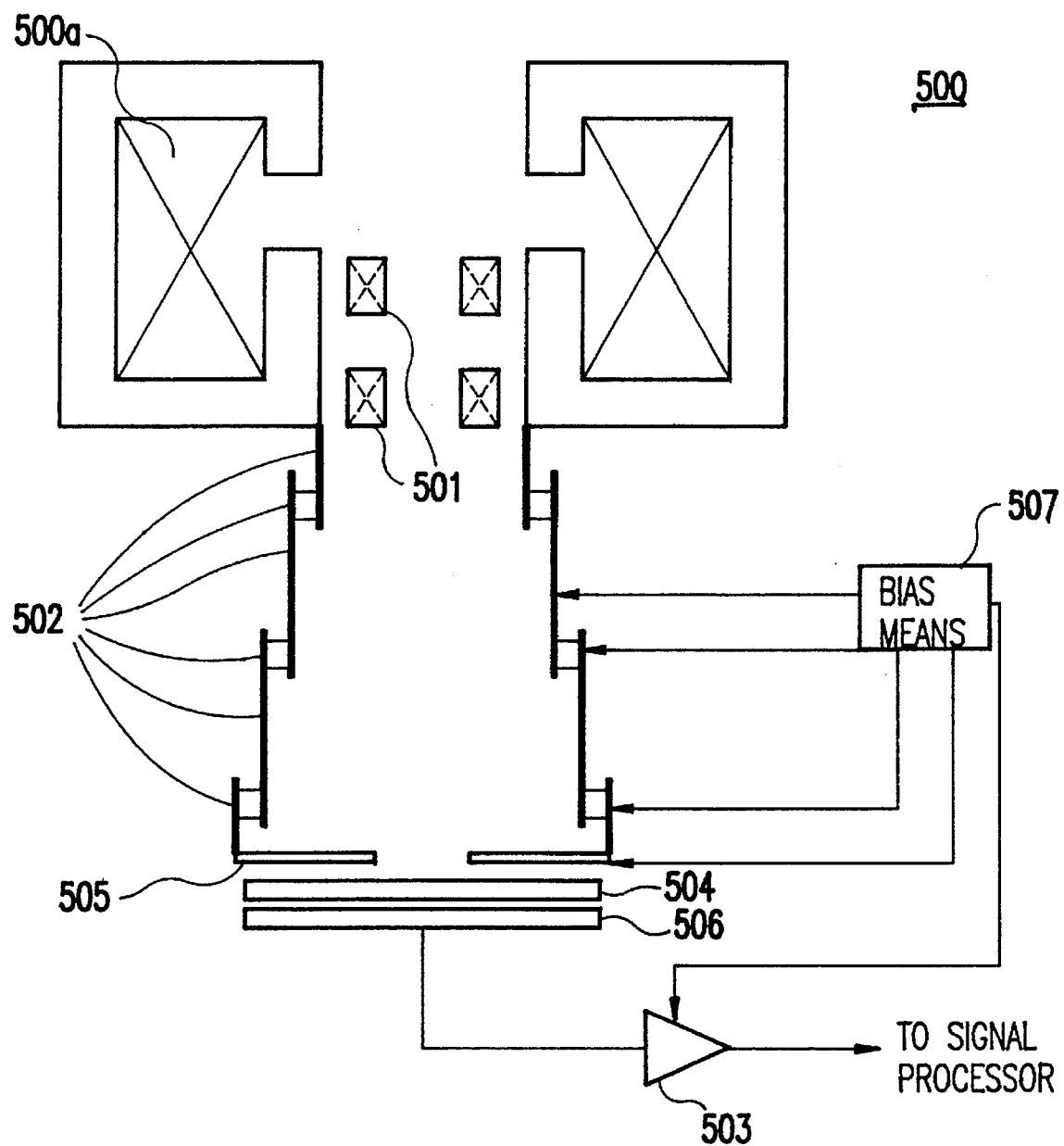
FIG. 5 is a cross-sectional view of a second embodiment of the present invention including a magnetic lens, upper and lower deflection yokes, a retarding electrode assembly, and an induced current detector.

The present invention, as shown in FIG. 5, includes the provision, positioning and implementation of a magnetic objective lens 500, a deflection system 501, retarding field electrodes 502, an induced current detector 503, a reference bias supply 507 for the current amplifier for measuring the current induced during irradiation of a target 504, and optionally one or more extraction grid(s) 505 and an extraction grid bias supply in combination. A suitable biasing device 507, as is known in the art, is provided for the electrodes 502 so as to bias the electrodes to predetermined potentials. Device 507 can be the same (or separate from) from the reference bias supply for the current detector 503 and a bias supply for grid 505.

Before describing the individual elements in greater detail, the overall performance requirements which the invention preferably meets to accomplish its unexpected advantages and benefits over the conventional systems, are described below.

For example, the structure of the invention preferably generates a beam landing energy of 500–800 eV and a spot size less than or equal to 5 micrometers, with a beam convergence semi-angle at the target of at least 5 milliradians. Maximum allowable deflection distortion is preferably limited to less than or equal to 1 mm. The initial beam energy is preferably greater than 5 kV and the deflection field size is preferably 30×30 mm., whereas the maximum beam landing angle is advantageously less than 5 degrees. The magnitude of the electrostatic field at the extraction grid is preferably less than 5 V/mm and the electrostatic field above the extraction grid is designed so that electrons emitted from the substrate which pass through the grid continue to travel away from the substrate as opposed to returning to the substrate. For the purposes of this description, an electrostatic field having this characteristic of not returning emitted electrons to the sample will be referred to as "extractive".

The criteria above are derived from the charging-characteristics of typical substrate materials, the expected minimum size of substrate features to be tested, the desired throughput which necessitates beam current and deflection field size, and the electrostatic field required for successful practice of the induced current test method (ICTM).

The beam landing energy criteria represents a worst case assumption with respect to the maximum landing energy which can be tolerated without significant insulator charging. If higher beam landing energies can be used with a particular insulator without causing insulator charging, then this higher energy can be used with improved spot size and beam current.

The expected spot size for a given design is calculated theoretically by methods well known in the field. The spot size is estimated by root-mean-square (rms) summation of the contributions from the aberration coefficients, assuming a 5 milliradian beam convergence semi-angle at the target. It is further assumed that curvature of field and astigmatism are corrected by stigmators and dynamic focus coils as commonly known in electron beam lithography. Deflection field distortion does not affect spot size and is in principle completely compensable in the deflection drive electronics. However, retarding field lenses may suffer from extreme distortions which may make compensation difficult. Thus, the present invention preferably limits distortion of the retarding field objective lens to less than 1 mm.

An initial primary beam energy of 5 kV is adequate to achieve high gun brightness. However, higher initial beam energies can be chosen but at the cost of decreased deflection sensitivity.

Since the induced current test method (ICTM), apart from actual table move time (e.g., moving specimen transfer table 30 shown in FIG. 4 from a lock port position 22 for loading a specimen onto the table to a position for analysis of a specimen), has no throughput penalty associated with having a deflection field smaller than the substrate, a field size of 30× 30 mm is preferably used and is deemed adequate.

Since secondary electron (SE) emission depends on the angle of incidence of the primary beam, charging uniformity is improved if the beam landing angle is limited to near normal incidence (e.g., an angle of substantially 90-degrees). In one embodiment, the present invention preferably allows up to a 5-degree departure from normal incidence, but of course any limit may be chosen as appropriate and thus the invention is not limited to a 5-degree departure from normal incidence.

The individual elements of the invention will now be described in more detail.

Retard/Extract Field Design

The above criteria related to the magnitude of the electrostatic field at the extraction grid and the requirement that the electrostatic field above the extraction grid be extractive, arise from the ICTM.

For the preferred embodiment of the ICTM, as described in Golladay mentioned above, a planar extraction grid(s) 505 (shown in FIG. 5, for example) formed of conductive wire (e.g., formed of wire meshes formed by first and second conductors orthogonally formed to one another, or the like), is preferably positioned above and parallel to the substrate surface. The extraction grid is biased by known biasing means (e.g., grid bias means) to determine the electrostatic field seen by emitted electrons and thereby to control the electron-beam charging process.

The purpose of the grid is to ensure that all nodes to be tested are subject to the same applied electrostatic field irrespective of their position within the deflection field. If the deflection field is small enough, the extraction field uniformity may be adequate for testing without an extraction grid. However, for the application to a field size of 30×30 mm a grid is preferably used. The grid is constructed of fine wire or the like, so as to be effectively transparent to the primary electron probe beam so that the primary beam can penetrate the grid without an unacceptable amount of dispersion. The grid is preferably mounted to but electrically isolated from the bottom retard electrode.

The magnitude of the electrostatic field at the grid is preferably less than 5 V/mm for several reasons.

First, the grid has a delicate physical construction and thus the electrostatic forces to which the grid is subjected should be minimized. Secondly, the grid should preferably approximate an equipotential surface to minimize any deleterious effects of the fine structure of the grid on the optics of the retarding lens. The non-uniformities of potential associated with the discrete grid wire structure are minimized when the electrostatic field in the vicinity of the grid is minimized. Since the region below the grid is substantially field-free (e.g., free of any electrostatic field), the field above the grid is preferably minimized as well.

Furthermore, electrons (e.g., SEs) emitted from the substrate and which pass through the extraction grid preferably are prevented from subsequently returning to the substrate by the electrostatic field above the extraction grid. Electrons which return to the sample would constitute a redistribution current. The redistribution current would be detected by the induced current detector. Redistribution current is preferably minimized so that the induced current detected is representative only of the charging current injected into or emitted from the node under test, i.e., that node whose capacitance is being measured.

Return of emitted electrons may appear unlikely in view of the fact that the electrostatic field, which retards the primary beam, acts as an accelerating field for the emitted SE and back-scattered electrons (BSE). After all, according to the present invention the substrate is at high negative potential (e.g. −4.4 kV).

However, as described below, it is desirable to operate one or more of the retarding electrodes at a potential even more negative than that of the substrate. In fact, considering only the primary beam optics, electrode potentials which would return SEs to the substrate provide quite acceptable performance. Therefore, a compromise must be made to optimize the retarding field for both the primary and emitted electrons.

These aspects of the invention are perhaps best illustrated by considering their implications for the axial potential distribution in the retarding electrostatic field. Using nominal values of substrate potential of −4.4 kV, and of the upper column 0 V, several possible distributions of the potential along the symmetry axis of the retarding field are illustrated in FIG. 6.

Figure 6:
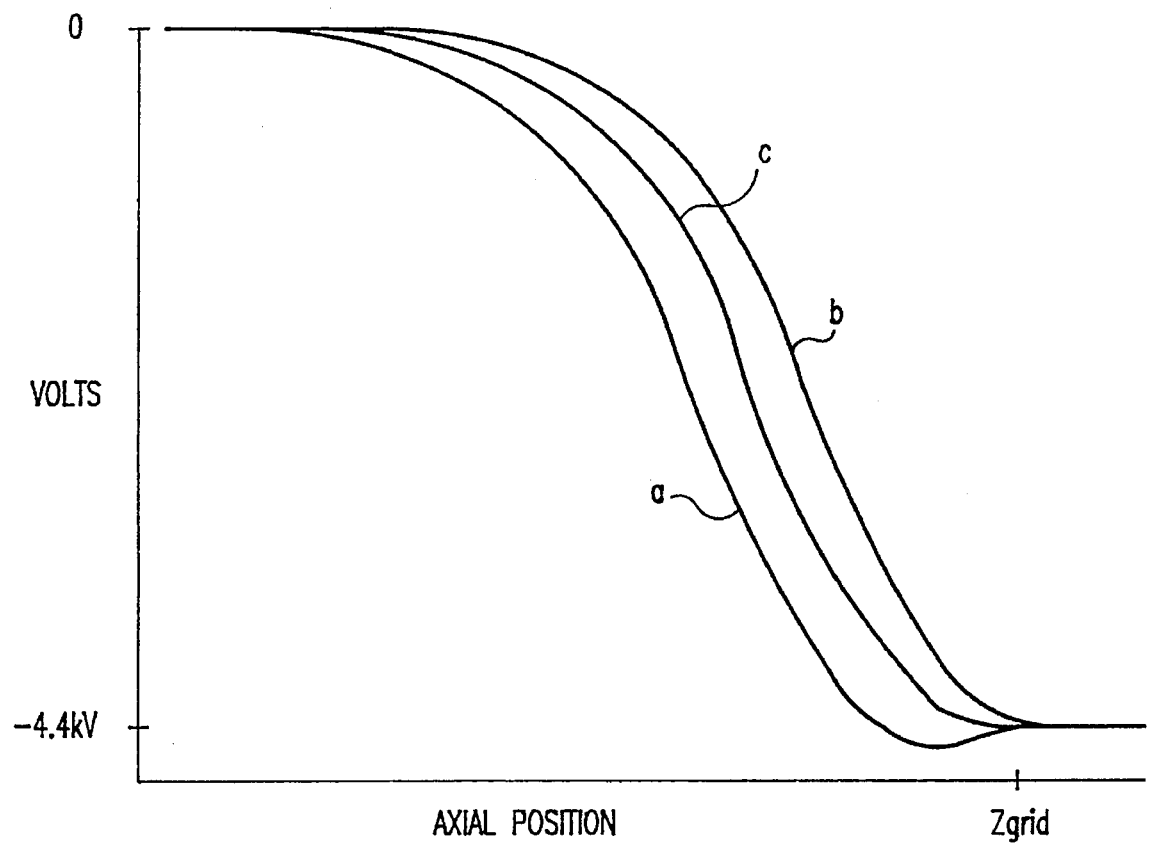
FIG. 6 illustrates possible electrostatic potential distributions as a function of position within the retarding field in which curve A shows a field which is unacceptable because too many emitted electrons would return to the substrate, i.e., the field is not extractive, curve B shows a field which is extractive but still unacceptable because the field is too strong at the extraction grid, and curve C illustrates a field which is acceptable in terms of being both extractive and weak at the extraction grid.

However, the distribution of curve a in FIG. 6 cannot be used because it is not extractive. The lowest energy emitted electrons would be reflected when they encounter equipotentials more negative than the −4.4 kV of the substrate, and of these electrons, some (depending on emission angle) would return to the sample.

Curve b is extractive but has overly strong fields at the grid. In contrast, Curve c is illustrative of the many possible distributions which are acceptable in terms of being extractive and yet having acceptably weak fields at the extraction grid.

Figure 7:
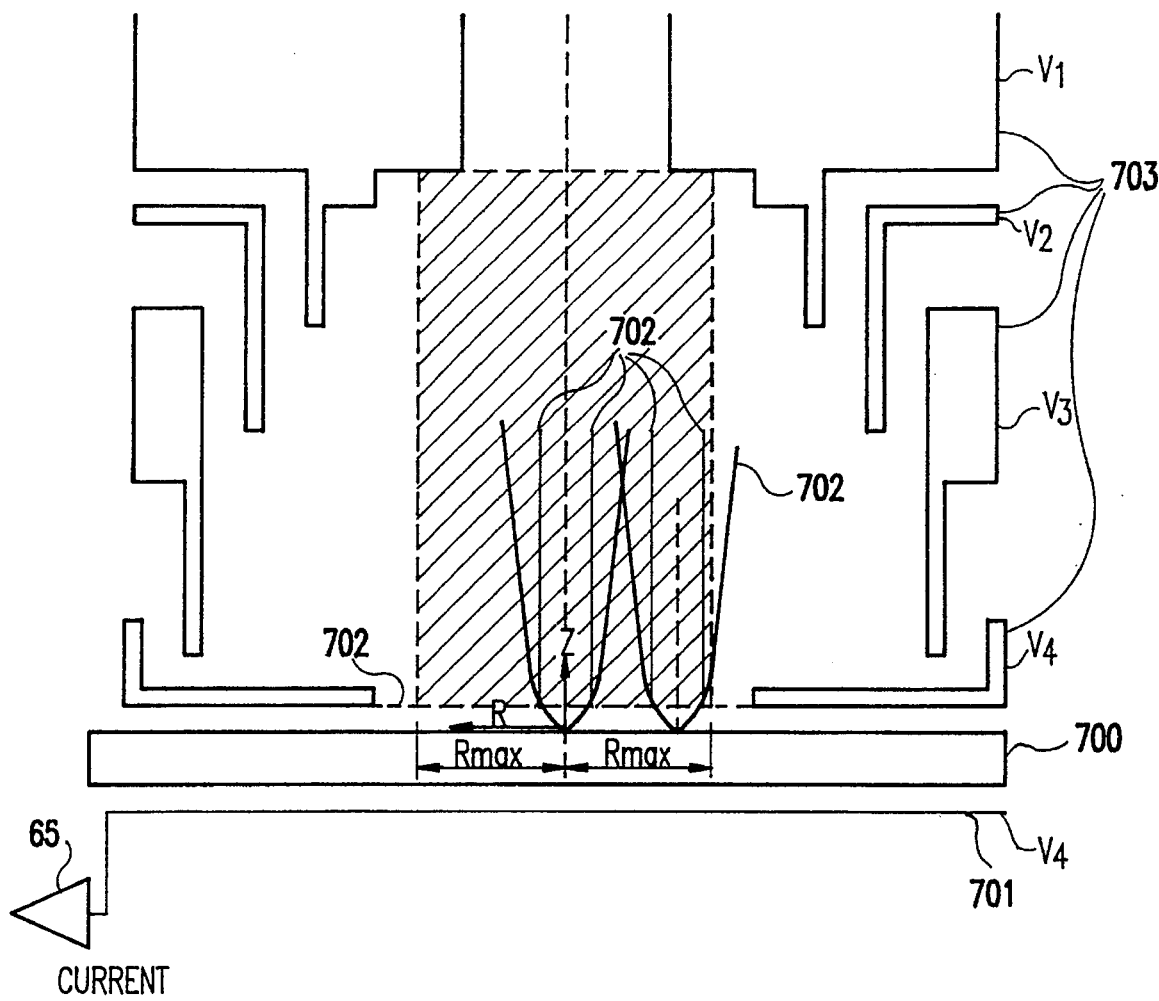
FIG. 7 is a cross-sectional view of the retarding electrodes of the invention, and also shows schematically the trajectories of emitted electrons.

The above discussion has related to the properties of acceptable axial distributions. Of course, the retarding potential distribution must meet the above requirements over the entire 30×30 mm deflection field. These requirements can be summarized succinctly in terms of the cylindrical coordinate system (r, z) illustrated in FIG. 7, in which r=0 defines the axis of symmetry for the magnetic and electrostatic elements, and z=0 at the surface of the substrate, and the extraction grid is at $z_{grid}$. The electrostatic field above the sample is described by the potential distribution V (r, z). If the maximum deflection is denoted by $R_{max}$, the field is extractive over the entire deflection field if $$V(r,z) \geq V(r, z_{grid}); \text{ for } z \geq z_{grid}, 0 \leq r \leq R_{max}.$$

Potential barriers at $r > R_{max}$ are permissible because few emitted electrons will encounter these barriers, and most of those emitted electrons that do encounter the barriers are prevented from reaching the sample by the solid structure of the retard electrode outside the deflection field area.

The requirement to minimize electrostatic field strength at the grid can be stated in terms of the derivative of the electrostatic potential as follows:

$$\delta V(r, z_{grid})/\delta z \leq 5 \text{ V/mm; for } 0 \leq r \leq R_{max}.$$

The retarding field arrangement according to the invention meets the requirements above and also those relating to the primary beam optics by providing a plurality of retarding electrodes, whose bias potentials are appropriately chosen as described below for one preferred embodiment.

Except for the bottom electrode, simple cylindrical tubes were chosen as the basic shape for the retarding electrodes, since detailed analysis shows that electrodes having such a configuration, if properly biased, as described below, are adequate to achieve the given design objectives. The bottom electrode has in addition to the cylindrical portion, a planar portion with a cutout where the extraction grid is mounted. This form and configuration of the electrodes facilitates the manufacturing and assembly of the present invention. However, as is clearly evident, more elaborate electrode configurations can be used, as desired, and it is envisioned that one of ordinary skill in the art taking this application as a whole could easily tailor the configuration of the electrodes to a plurality of shapes.

Again referring to FIG. 7, which illustrates a cross-section of a plurality of electrodes 703 of the retarding field lens system, the axis of cylindrical symmetry is shown as a vertical dashed line. The bottom electrode (e.g., V4) corresponds to the extraction grid which is biased to $V_{sub}$, nominally −4.4 kV. The substrate is assumed to be several millimeters below the extraction grid and below the substrate is a planar electrode also biased to $V_{sub}$. The substrate is therefore between two electrodes at the same potential and thus there are no electrostatic fields present at the substrate.

The top electrode V1 is grounded so that the electrode structure can be simply mounted to the grounded body of the magnetic lens (unreferenced) above. The bottom electrode and extraction grid are biased to the sample potential $V_{sub}$. For the given geometrical arrangement of electrodes, two free parameters (e.g., the potentials on the interior electrodes, V2 and V3, respectively) remain which can be selectively adjusted to obtain the required extraction field above the grid and to assist in meeting the criteria for the primary beam.

Appropriate values of V2 and V3 are chosen by considering that the field above the grid be extractive for SEs. For a given electrode geometry and any values of V2 and V3, the potentials throughout the retarding field are calculated by standard numerical methods, such as those embodied in the software package "Litho" which is commercially available, and well known in this field.

Figure 8A:
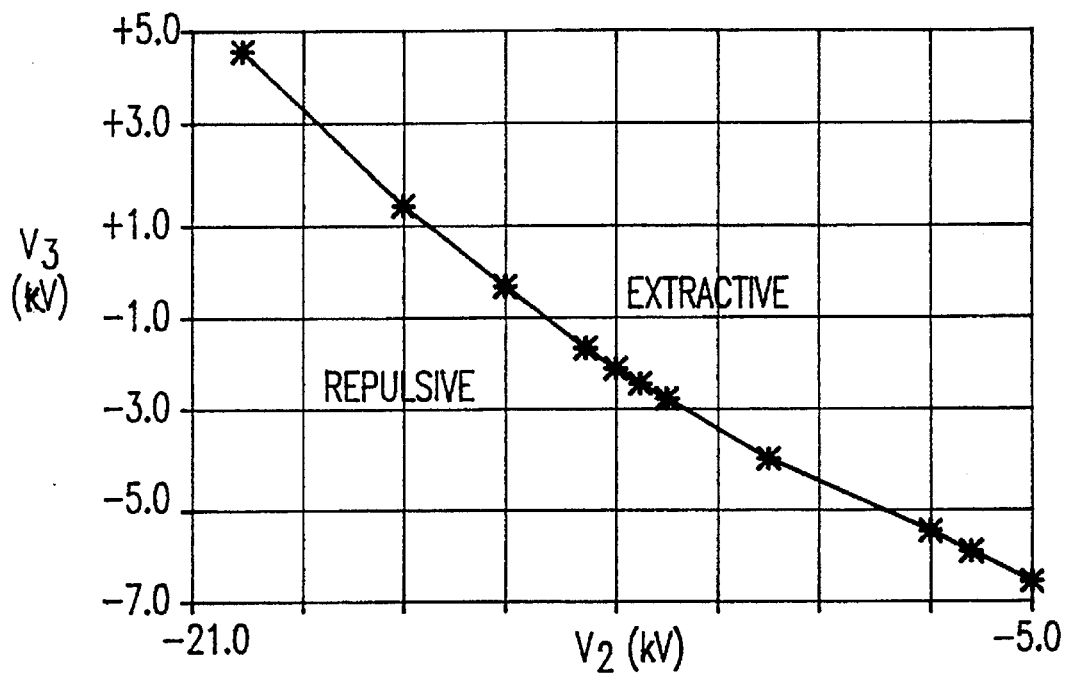
FIG. 8(a) illustrates the minimum voltage (e.g., V3) needed on an electrode (e.g., a third electrode) used by the inventive system, for SE extraction at the field corners as a function of the voltage (e.g., V2) on another electrode (e.g., a second electrode) of the inventive system.

For each value V2, the minimum value of V3 was determined such that the potential V (r, z) is extractive for $0 \leq r \leq R_{max}$. For the electrode geometry of FIG. 7 and for $R_{max}$ 23 mm (allowing coverage of a 30×30 mm deflection field), the results of the analysis are shown in FIG. 8(a). For any given value of V2, V3 must be on or above the curve in FIG. 8(a) in order for the field to be extractive over the entire deflection field.

Figure 8B:
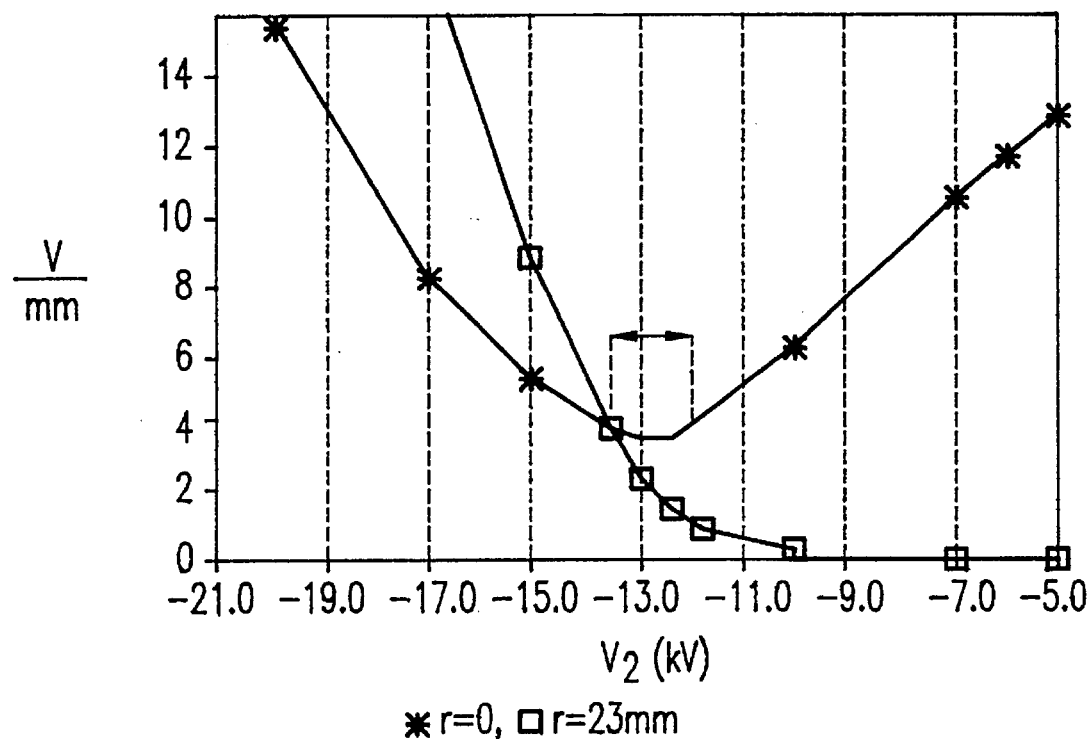
FIG. 8(b) illustrates the electrostatic field above an extraction grid in the center and field corners as a function of V2, V3 chosen from the curve of FIG. 8(a) in which weak fields are obtainable for −13.5 kV<V2<−12.0 kV.

To further narrow the choices for V2 and V3, the criteria of minimal extraction field strength at the extraction grid was applied. In FIG. 8(b), the field strength at the grid is plotted as a function of V2. For each value of V2, V3 is given by the curve in FIG. 8(a). The field strength is shown both at the center and at the corner of the deflection field. Acceptably weak fields (<5 V/mm) are obtained provided that −13.5 kV<V2<−12 kV.

Figure 9:
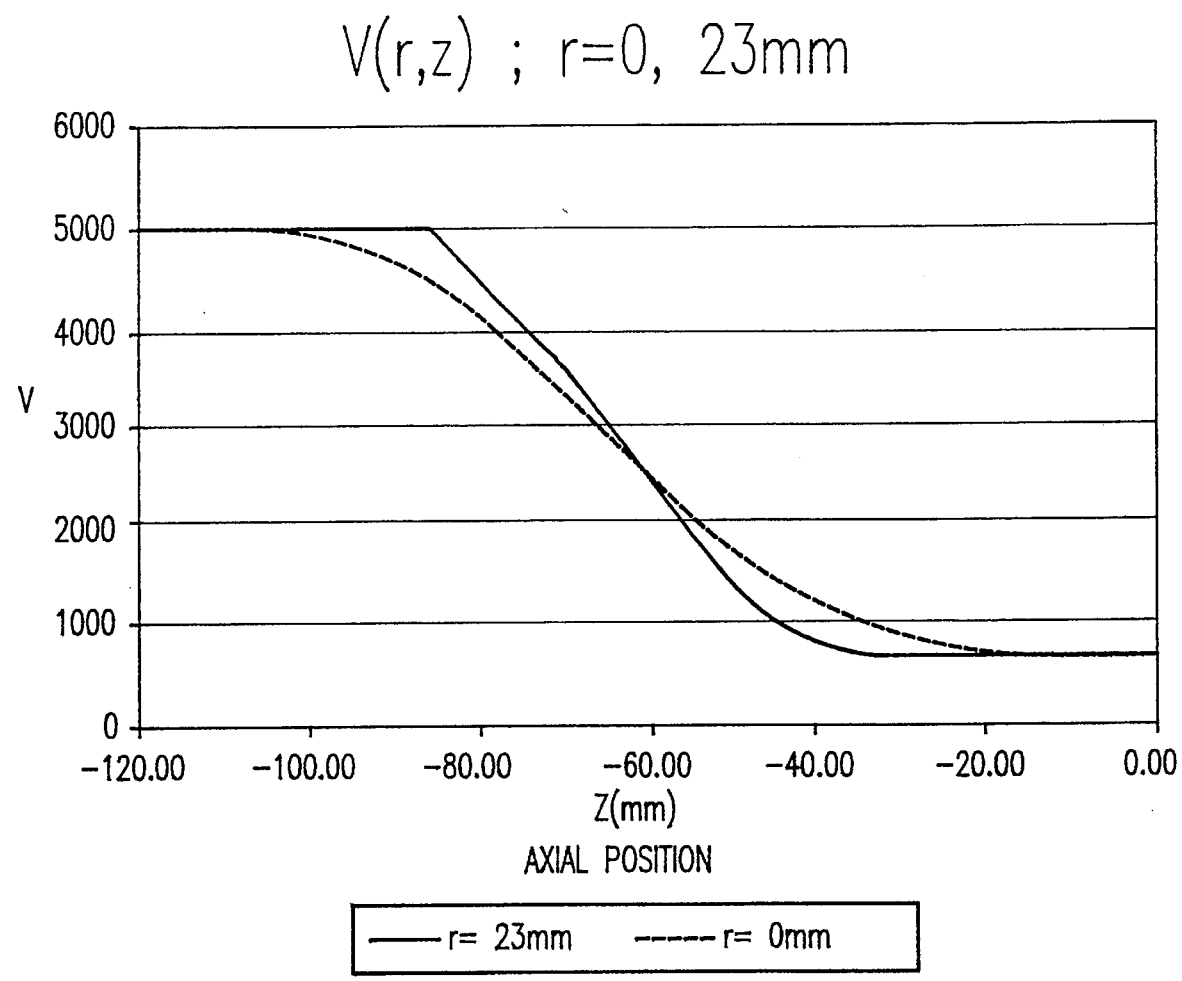
FIG. 9 illustrates the electrostatic potential as a function of axial position at r=0 and r=23 mm for a selected value of V2 and V3, (e.g., V2=−12.8 kV, V3=−2.257 kV)

The axial potentials obtained for V2=−12.8 kV and V3=−2.257 kV are illustrated in FIG. 9 in which the potential, V(r, z) for r=0 and r=23 mm is plotted. The plots illustrate the fulfillment of the extractive and weak criteria.

The other components of the retarding field objective lens and the complete system with respect to its performance in focusing and deflecting the primary beam are described below.

Magnetic Lens and Deflection Yokes

Again looking at the retarding field objective lens design shown in FIG. 5, the retarding field objective lens system 500 preferably includes a combination of a magnetic lens 500a, upper and lower magnetic deflection yokes (e.g., coils) 501 in addition to the electrode assembly 502 mounted beneath the magnetic lens 500a.

The magnetic lens 500a is conventional. However, to minimize overall system length, a large bore design is preferably used so that a large diameter yoke (e.g., coil) can be accommodated within the lower part of the lens bore. The meaning of the term "large bore", with regard to this application, will be described below.

The excitation of the magnet lens 500a is adjusted to focus the primary beam onto the substrate 504. Dynamic focus and stigmator elements, (not illustrated) as are commonly known, are provided in accordance with standard practice for electron beam lithography columns.

The deflection yokes 501 are conventional and can be of a saddle or toroidal configuration. The yoke turns are preferably distributed angularly to eliminate four-fold deflection aberrations in accordance with standard practice. To keep the overall system length short the coils are positioned partially within the body of the magnetic lens 501. However, the coils are located below the lens gap, because in that position the coils can be surrounded by ferrite shielding material without materially disturbing the lens field. The cylindrical ferrite shield is needed to prevent the penetration of the magnetic deflection fields into the bulk metallic components of the magnetic lens 501, where eddy currents would be generated which in turn would cause time dependent beam position errors.

The optical properties of a complete system including the magnetic lens, deflection yoke, and retarding field have been calculated with the aforementioned commercially available programs for electron-optical design. With these programs, the influence of the magnetic lens geometry, the yoke geometry, position, orientation, and deflection sensitivity on the optical performance can be calculated.

These calculations show that a wide range of yoke geometries and positions can provide acceptable performance provided there are at least two sets of yokes, an upper yoke, and a lower yoke and that the two sets are in a proper relationship in terms of the deflection sensitivity of the upper yoke relative to the lower yoke, and the angular orientation of the upper yoke relative to the lower yoke.

Figure 10:
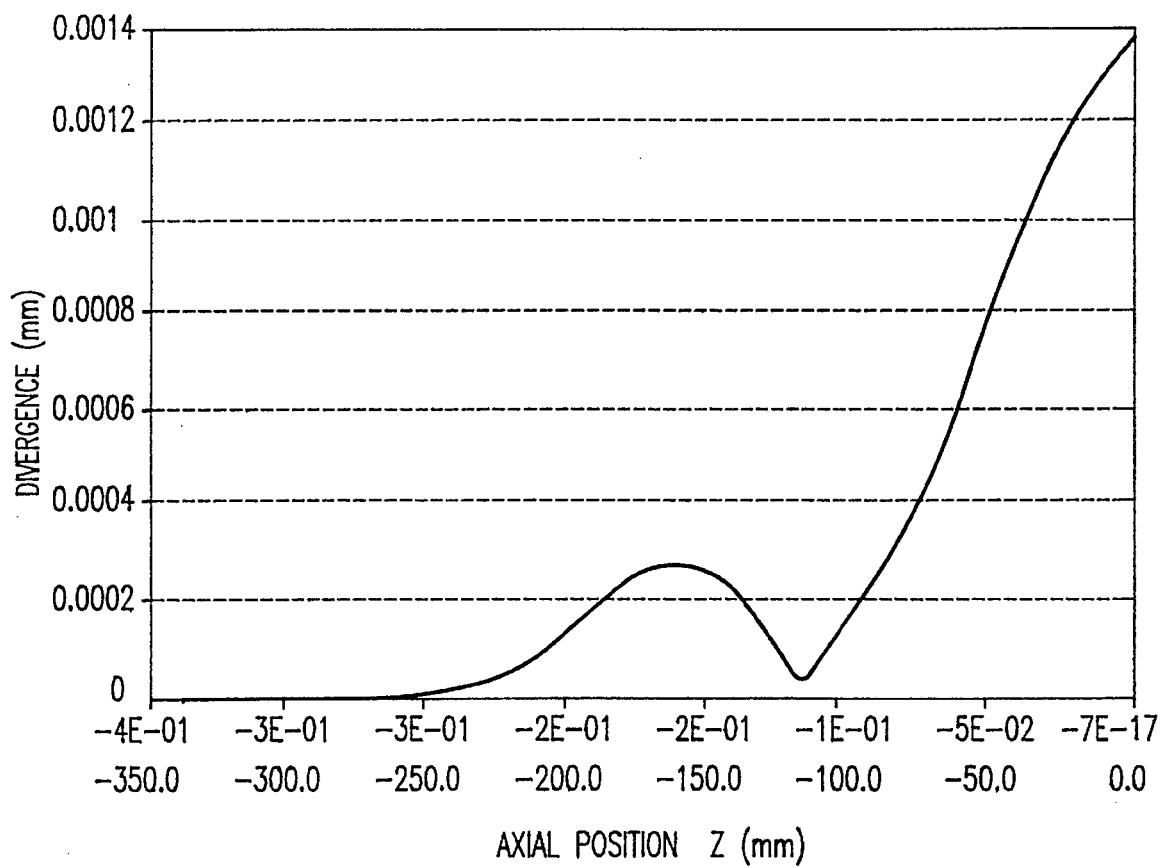
FIG. 10 illustrates the deflected beam trajectory within the deflection yokes and the retarding electrostatic field, with the distance from the beam to the optical axis being plotted as a function of axial position.

The optimal yoke relationship has the upper and lower yokes approximately opposing each other, with the lower yoke having higher deflection sensitivity. This relationship causes the deflected beam to cross the optical axis of the system deep within the retarding field. The deflected beam trajectory within the retarding field is illustrated in FIG. 10. The deflected trajectory of FIG. 10 is critical to achieving the desires of the system performance and is fundamentally different from that of the conventional system shown in FIG. 2, in which the beam enters the retarding field parallel to the optical axis.

Since, as described above, the optimum yoke configuration has the upper and lower yokes opposing each other, the primary beam is relatively far off-axis in the lower yoke. The accuracy of the electron-optical modeling software used to calculate the lens properties is compromised if the electron trajectories are off-axis by a distance which is relatively large compared to the yoke radius. The acceptable minimum yoke radius must be chosen taking this factor into account, and will vary with the field size and beam size required for the application. In one embodiment, for example, the present invention has utilized a yoke radius approximately six times as large as the beam off-axial distance.

The factors which dictate system design include beam landing angle and the coma, transverse chromatic, and distortion aberrations. The design objectives for system performance can be met if the relative strengths and angular orientations of the upper and lower deflection yokes are optimally chosen.

For example, if the ratio of magnetic field strength in the lower yoke to the upper yoke is denoted by S, and by the relative orientation of lower to upper yokes by θ, then there exists an operating window centered on S=3, θ=−171° which meets the criteria discussed above.

Figure 11:
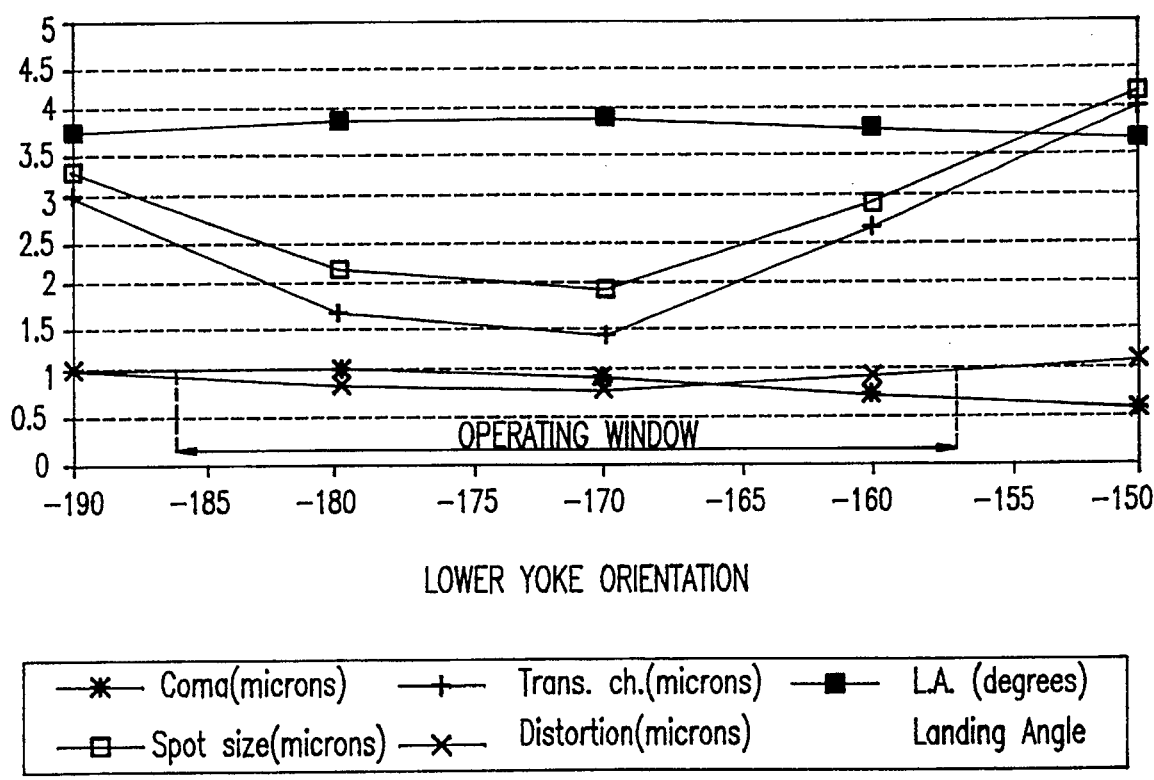
FIG. 11 shows the lens properties as a function of the lower yoke orientation for the case of a strength ratio of the lower yoke/upper yoke of 3.0.

FIG. 11 illustrates how the landing angle and the aberrations change as a function of θ for S=3. An energy spread for the beam of 1.5 ev and a 5 mr beam convergence half-angle at the target which is ample to provide a beam current of at least 100 na, are also assumed.

FIG. 12 shows the calculated first and third order optical properties of the an embodiment of the retarding field objective lens for S=3.0, θ=−170°.

Induced Current Detector

Another aspect of the present invention is an induced current detector. As current is injected into networks by the electron beam, currents are induced in a conducting structure capacitively coupled to the networks. The induced current signals are analyzed to determine substrate opens and shorts and to measure network capacitance.

In contrast to the conventional approach which would have the substrate and associated capacitively coupled structure and current amplifier at ground potential, for the present invention the conductive structure is at the elevated negative potential required to elevate the sample potential to achieve the desired beam landing energy. Referring to FIG. 5, the induced current amplifier 503 is therefore constructed so that it can be referenced to the negative high voltage, e.g., −4.4 kV, and thereby provide the negative high voltage for the conductive structure 506. The induced current in the structure 506 is detected, amplified, and down-converted to a signal referenced to 0 volts for further processing.

In implementation, the induced current detector is preferably used in conjunction with the system illustrated in FIG. 3 or FIG. 5.

According to the present invention, a retarding field objective lens and deflection system is provided to produce a small, high current probe, and means including magnetic deflectors for deflecting the probe over a large field while maintaining acceptable spot size.

With the invention, a completely non-contact testing method and system is provided which avoid contact damage and specimen contamination problems which are inherent to contact testing methods, and which increase the testing speed using the electron beam as opposed to a mechanically movable probe. The invention teaches how to design and bias a retarding field electrode assembly so as to provide a retarding field which is compatible with the practice of the induced current test method; that is a retarding field suitable for use either with or without a planar extraction grid provided above the substrate being tested. In either case the retarding field provides a weak and relatively uniform extraction field for electrons emitted from the substrate. The invention includes means for detecting the induced current signal from a substrate at elevated potential.

While the invention has been described in terms of a two preferred embodiments, those skilled in the art will recognize that the invention can be practiced with modification within the spirit and scope of the appended claims.

Having thus described my invention, what I claim as new and desire to secure by Letters Patent is as follows:

1. An electron optical system for irradiating a sample, comprising:
    an electron source for producing a first electron beam, wherein said first electron beam has an energy level above 1 kV;
    a retarding field objective lens system for receiving and focussing said first energy electron beam to produce a second focussed electron beam, wherein said second focussed electron beam has an energy level below 1 kV; and
    a magnetic deflector for deflecting said second focussed electron beam to said sample, thereby to expose said sample to said second focussed electron beam, and simultaneously maintaining a predetermined spot size of said second focussed electron beam, said sample being biased to a predetermined elevated potential,
    wherein said magnetic deflector includes a plurality of deflection yokes, wherein a second deflection yoke of said deflection yokes is positioned closer to said sample than a first deflection yoke of said deflection yokes, said second deflection yoke having a higher deflection sensitivity than that of said first deflection yoke and having a deflection direction substantially opposed to that of said first deflection yoke such that a deflected electron beam approaches an optical axis of said system within a retarding field formed in said system.

2. An electron optical system according to claim 1, further comprising an induced current signal detector for detecting an induced current signal being produced when said sample is exposed to said second focussed electron beam.

3. An electron optical system according to claim 1, wherein said retarding field objective lens system includes means for retarding electrons in said second focussed electron beam directed to said sample and for accelerating electrons, emitted by said sample upon being irradiated by said second focussed electron beam.

4. An electron optical system according to claim 1, wherein said retarding field objective lens system includes a magnetic lens having a predetermined bore, and first and second magnetic deflection yokes,
    wherein a relative strength and a relative orientation between said first and second magnetic deflection yokes are selectively adjustable so as to maintain a predetermined electron beam spot size and a predetermined electron beam landing angle.

5. An electron optical system for noncontact testing of an electrical device, comprising:
    means for biasing said electrical device to a predetermined elevated potential;
    means for receiving a first electron beam and for producing a second focussed electron beam to expose said electrical device to said second focussed electron beam, and simultaneously maintaining a predetermined spot size of said beam, an induced current signal being produced when said electrical device is exposed to said second focussed electron beam, wherein said first electron beam has an energy level above 1 kV and said second focussed electron beam has an energy level below 1 kV;

induced current detecting means for detecting said induced current signal to determine characteristics of said electrical device; and means for deflecting said second focussed electron beam, comprising a plurality of deflection yokes, wherein a second deflection yoke of said deflection yokes is positioned closer to said sample than a first deflection yoke of said deflection yokes, said second deflection yoke having a higher deflection sensitivity than that of said first deflection yoke and having a deflection direction substantially opposed to that of said first deflection yoke such that a deflected electron beam approaches an optical axis of said system within a retarding field formed in said system.

6. An apparatus for noncontact testing of a sample, comprising:

means for biasing said sample to a predetermined elevated potential;

means for producing a focussed electron beam having an energy level below 1 kV;

means for deflecting said focussed electron beam to said sample, thereby to expose said sample to said focussed electron beam, and simultaneously maintaining a predetermined spot size of said beam, an induced current signal being produced when said sample is exposed to said focussed electron beam; and induced current detecting means for detecting said induced current signal to determine characteristics of said sample, wherein said means for deflecting includes a plurality of deflection yokes, wherein a second deflection yoke of said deflection yokes is positioned closer to said sample than a first deflection yoke of said deflection yokes, said deflection yoke having a higher deflection sensitivity than that of said first deflection yoke and having a deflection direction substantially opposed to that of said first deflection yoke such that a deflected electron beam approaches an optical axis of said apparatus within a retarding field formed in said apparatus.

7. An apparatus according to claim 6, wherein said means for producing includes a magnetic lens having a predetermined bore, and first and second magnetic deflection yokes, wherein a relative strength and a relative orientation between said first and second magnetic deflection yokes are selectively adjustable so as to maintain a predetermined electron beam spot size and a predetermined electron beam landing angle.

8. An apparatus according to claim 7, wherein said electron beam producing means includes means for producing said focused electron beam having a predetermined kinetic energy, wherein said means for producing includes means for decelerating said electron beam in a predetermined portion between said magnetic lens and said sample thereby to provide an electron beam having a predetermined landing energy lower than that of said predetermined kinetic energy.

9. An apparatus according to claim 8, wherein said decelerating means includes means for producing an electrostatic field having a predetermined axial potential distribution.

10. An apparatus according to claim 6, further comprising means for retarding electrons in said focussed electron beam directed to said sample and for accelerating electrons, emitted by said sample upon being irradiated by said focussed electron beam, in a direction away from said sample.

11. An apparatus according to claim 8, wherein said biasing means biases said induced current detecting means to said predetermined elevated potential.

12. An apparatus according to claim 6, wherein said induced current detecting means includes a current amplifier, said induced current being induced in a conductive structure one of within said sample being tested when said sample is irradiated by said focussed electron beam and external to said sample being tested.

13. An apparatus according to claim 6, wherein said induced current detecting means includes a current amplifier, wherein said amplifier is at said elevated potential of said sample.

14. An apparatus according to claim 6, wherein said means for retarding includes a magnetic objective lens having a predetermined bore, and first and second magnetic deflection yokes, wherein a relative strength and a relative orientation between said first and second magnetic deflection yokes are selectively adjustable so as to maintain a predetermined electron beam spot size and a predetermined electron beam landing angle.

15. An apparatus according to claim 6, further comprising an extraction grid positioned between said means for deflecting and said sample.

16. An apparatus according to claim 15, wherein an electrostatic field at said extraction grid is less than 5 V/mm and the electrostatic field above the extraction grid is extractive.

17. An apparatus according to claim 15, further comprising means for biasing said extraction grid for altering an electrostatic field of said extraction grid.

18. An apparatus according to claim 15, wherein an electrostatic field above said extraction grid is extractive for emitted electrons.

19. An apparatus according to claim 15, further comprising a plurality of electrodes for retarding electrons in said focussed electron beam directed to said sample and for accelerating electrons, emitted by said sample upon being irradiated by said focussed electron beam, wherein a first electrode of said plurality of electrodes is at ground potential and wherein potentials of electrodes beneath said first electrode are adjustable such that an electrostatic field above said extraction grid is selectively adjustable.

20. An apparatus according to claim 6, wherein an angle of incidence of said electron beam is no more than 5 degrees with respect to the normal to a surface of the electrical device being irradiated.

21. An apparatus according to claim 6, wherein said induced current detecting means comprises means for detecting, amplifying and down-converting said induced current to a signal referenced to 0 volts.

22. An apparatus according to claim 6, wherein said induced current means comprises:

a current amplifier connected to a conductive structure one of within said sample and external to said sample, said induced current being referenced to a negative voltage.

* * * * *